United States Patent
Kim et al.

(10) Patent No.: US 8,399,364 B2
(45) Date of Patent: Mar. 19, 2013

(54) METHODS OF FABRICATING SEMICONDUCTOR DEVICES INCLUDING MULTILAYER DIELECTRIC LAYERS

(75) Inventors: Kil-chul Kim, Seongnam-si (KR); Jong-cheol Lee, Seoul (KR); Ki-vin Im, Seongnam-si (KR); Jae-hyun Yeo, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 13/019,636

(22) Filed: Feb. 2, 2011

(65) Prior Publication Data
US 2011/0230056 A1   Sep. 22, 2011

(30) Foreign Application Priority Data
Mar. 16, 2010   (KR) .................. 10-2010-0023405

(51) Int. Cl.
*H01L 21/471* (2006.01)
(52) U.S. Cl. ................. 438/763; 438/785; 257/E21.493
(58) Field of Classification Search .............. 438/785, 438/763
See application file for complete search history.

(56) References Cited

U.S. PATENT DOCUMENTS

| | | | |
|---|---|---|---|
| 2006/0264067 A1* | 11/2006 | Kher et al. | 438/785 |
| 2008/0020593 A1 | 1/2008 | Wang et al. | |
| 2008/0102259 A1* | 5/2008 | Nikolov et al. | 428/213 |
| 2008/0164582 A1* | 7/2008 | Govindarajan | 257/635 |
| 2010/0006954 A1* | 1/2010 | Huang et al. | 257/410 |

FOREIGN PATENT DOCUMENTS

| | | |
|---|---|---|
| JP | 2005-079223 | 3/2005 |
| KR | 1020080061486 A | 7/2008 |
| KR | 1020090032971 A | 4/2009 |

* cited by examiner

*Primary Examiner* — Alexander Ghyka
(74) *Attorney, Agent, or Firm* — Myers Bigel Sibley & Sajovec

(57) ABSTRACT

Methods of manufacturing semiconductor devices including multilayer dielectric layers are disclosed. The methods include forming a multilayer dielectric layer including metal atoms and silicon atoms on a semiconductor substrate. The multilayer dielectric layer includes at least two crystalline metal silicate layers having different silicon concentrations. The multilayer dielectric layer may be used, for example, as a dielectric layer for a capacitor, or as a blocking layer for a nonvolatile memory device.

11 Claims, 8 Drawing Sheets

METHODS OF FABRICATING SEMICONDUCTOR DEVICES INCLUDING MULTILAYER DIELECTRIC LAYERS

CROSS-REFERENCE TO RELATED APPLICATIONS

This application claims priority under 35 U.S.C. §119 from Korean Patent Application No. 10-2010-0023405, filed on Mar. 16, 2010, in the Korean Intellectual Property Office, the disclosure of which is incorporated herein in its entirety by reference.

BACKGROUND

The inventive concept relates to methods of manufacturing semiconductor devices, and more particularly, to methods of manufacturing semiconductor devices including dielectric layers.

As the demand for smaller, more powerful electronic devices has increased, semiconductor technologies have advanced to keep up with those demands. In this regard, there is an ongoing need to increase the integration density and improve the performance of semiconductor devices that are the main components of such electronic devices.

Insulating layers are integral parts of most semiconductor devices. However, as the integration density of semiconductor devices increases and the size of features in the devices decreases, the demands placed on insulating layers in the devices become greater. In particular, some insulating layer materials used in manufacturing conventional semiconductor devices may not meet design requirements for such material properties as permittivity and/or insulation as their size decreases.

SUMMARY

The inventive concept provides methods of manufacturing semiconductor devices including multilayer dielectric layers.

According to an aspect of the inventive concept, there is provided a method of manufacturing a semiconductor device, the method comprising: forming a multilayer dielectric layer comprising metal atoms and silicon atoms on a semiconductor substrate; wherein the forming of the multilayer dielectric layer comprises forming at least two crystalline metal silicate layers having different silicon concentrations, which are ratios of silicon atoms with respect to sums of metal atoms and silicon atoms.

The multilayer dielectric layer may be formed to have a crystalline structure of a cubic system, a tetragonal system, or an orthorhombic system.

The forming of the multilayer dielectric layer comprises forming a first crystalline metal silicate layer having a first silicon concentration and forming a second crystalline metal silicate layer having a second silicon concentration greater than the first silicon concentration.

The first crystalline metal silicate layer and the second crystalline metal silicate layer are formed of a hafnium-zirconium silicate.

The forming of the multilayer dielectric layer comprises forming at least two first crystalline metal silicate layers, and forming the second crystalline metal silicate layer between the at least two first crystalline metal silicate layers.

The forming of the multilayer dielectric layer comprises at least two the second crystalline metal silicate layers, and forming the first crystalline metal silicate layer between the at least two second crystalline metal silicate layers.

The multilayer dielectric layer is formed in such a way that a ratio of the silicon atoms with respect to a sum of the metal atoms and the silicon atoms that are included in the multilayer dielectric layer is in the range of about 3% to about 8%.

The second crystalline metal silicate layer is formed in such a way that the second silicon concentration is in the range of about 10% to about 20%.

The forming of the multilayer dielectric layer comprises: forming the first crystalline metal silicate layer having the first silicon concentration in an in-situ crystallized state; and forming the second crystalline metal silicate layer having the second silicon concentration greater than the first silicon concentration on the first crystalline metal silicate layer.

The forming of the second crystalline metal silicate layer comprises forming the second crystalline metal silicate layer in an in-situ crystallized state by using the first crystalline metal silicate layer as a seed.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
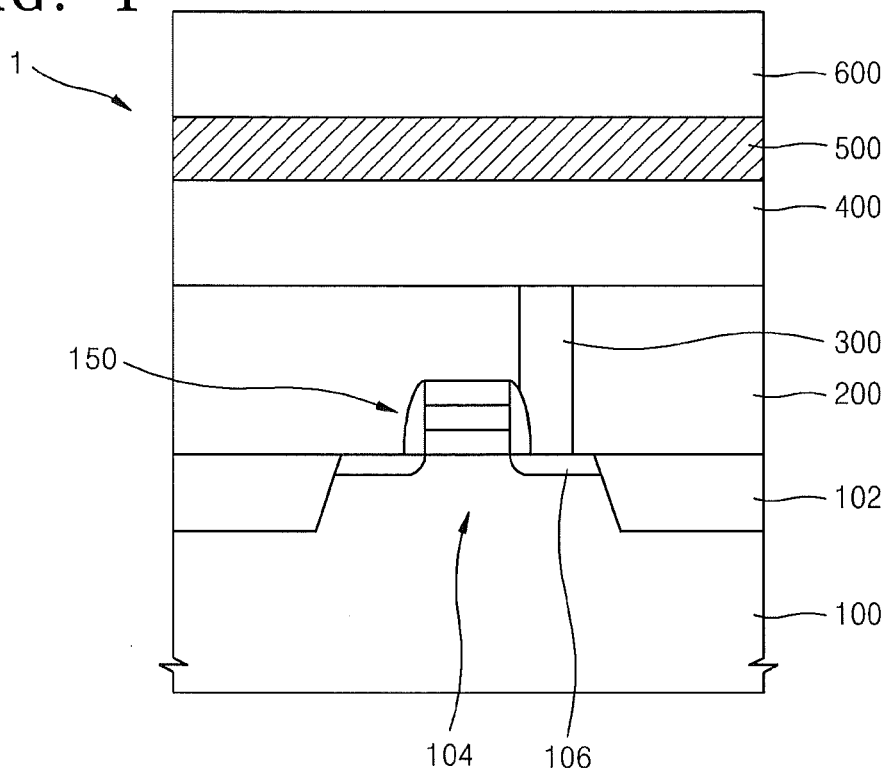
FIG. 1 is a cross-sectional view of a semiconductor device including a multilayer dielectric layer according to some embodiments.

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional description of the inventive concept are provided in descriptive sense only; various changes in form and details may be made therein and thus should not be construed as being limited to the embodiments set forth herein. As the inventive concept is not limited to the embodiments described in the present description, and thus it should not be understood that the inventive concept includes every kind of variation examples or alternative equivalents included in the spirit and scope of the inventive concept.

In the present description, terms such as 'first', 'second', etc. are used to describe various elements. However, it is obvious that the elements should not be defined by these terms. The terms are used only for distinguishing one element from another element. For example, a first element which could be termed a second element, and similarly, a second element may be termed a first element, without departing from the teaching of the inventive concept.

It will be understood that when an element is referred to as being "connected to", or "contacting" another element throughout the specification, it can be directly "connected to" or "contacting" the other element, or intervening elements may also be present. On the other hand, when a component is referred to as being "directly connected to" or "directly contacting" another element, it will be understood that no intervening element is present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

FIG. 1 is a cross-sectional view of a semiconductor device 1 including a multilayer dielectric layer, according to some embodiments.

Referring to FIG. 1, the semiconductor device 1 includes a multilayer dielectric layer 500 formed on a semiconductor substrate 100 to be used as a dielectric layer of a capacitor. The semiconductor substrate 100 may be formed of a general semiconductor such as silicon. An impurity injection region (not shown), for example, a well for forming the semiconductor device (e.g., a transistor), may be formed in the semiconductor substrate 100. A device separation layer 102 may also be formed on the semiconductor substrate 100. The device separation layer 102 may include, for example, silicon oxide. An active region 104 isolated by the device separation layer 102 may be formed on the semiconductor substrate 100. Source and drain regions 106 may be formed in the active region 104, and a gate structure 150 including a gate insulating layer and a gate line may be formed on the active region 104 so as to form a transistor. A bit line (not shown) may further be formed on the semiconductor substrate 100. An interlayer insulating layer 200 including a contact plug 300 connected to the transistor via the active region 104 may be formed on the semiconductor substrate 100.

The interlayer insulating layer 200 may be configured as a single layer or may be a multilayer that is obtained by at least two deposition processes. For example, the interlayer insulating layer 200 may include any one or combination of an insulating layer separating gate lines, an insulating layer separating bit lines, an insulating layer separating gate lines and bit lines, and an insulating layer covering bit lines. Each of these insulating layers may be configured as a single layer, or may be configured as a single layer that is obtained by at least two deposition processes. The interlayer insulating layer 200 may include, for example, a silicon oxide layer.

The contact plug 300 may be formed by etching the interlayer insulating layer 200 to expose the active region 104, and in particular, the source or drain regions 106. The contact plug 300 may be formed by stacking a doped polysilicon, a metal, a metal silicide, or a metal nitride, or may be formed by using only a doped polysilicon. However, when the interlayer insulating layer 200 is configured as a multilayer, the contact plug 300 may be formed in various steps. For example, the contact plug 300 may be formed in two steps including, for example, forming a landing pad connected to the transistor via the active region 104, in particular, the source or drain regions 106, by etching a part of the insulating layer separating gate lines and forming an embedded plug connected to the landing pad by etching a part of the insulating layer separating gate lines and bit lines. The landing pad and the embedded plug may be formed by stacking a doped polysilicon, a metal, a metal silicide, or metal nitride, or may be formed by using only a doped polysilicon. An additional plug connected to the embedded plug may further be formed when required.

The gate line may be electrically insulated from the active region 104 by the gate insulating layer, and may include a doped polysilicon, a metal such as tungsten (W), titanium (Ti), or copper (Cu), a metal silicide, and/or a metal nitride, or may be configured as a stack structure including at least one of the foregoing. In addition, a capping pattern may be formed on the gate line, and gate spacers may be formed on side surfaces of the gate line and capping pattern so as to form the gate structure 150. The gate insulating layer may be formed using a silicon oxide layer or an insulating layer having a high dielectric constant. In addition, the capping pattern and the gate spacer may be formed using a silicon nitride layer.

The bit line may be formed crossing or parallel to the gate line, and may be insulated from the gate line by insulating materials. The bit line may be, formed of a doped polysilicon, a metal (W, Ti, Cu, or the like), a metal silicide, and/or a metal nitride, or may be configured as a stack structure including at least one of the foregoing. A bit line capping pattern (not shown) may be formed on the bit line, and bit line spacers (not shown) may be formed on side surfaces of the bit line and bit line capping pattern.

In order to form a capacitor, a lower electrode layer 400 as a conductor connected to the contact plug 300 may be formed. The lower electrode layer 400 may be formed of a material that does not cause oxidization in the subsequent process. The lower electrode layer 400 may include a polysilicon, a metal, a metal nitride, and/or a metal silicide, or may be formed of a conductor that is a combination of the foregoing.

Although the lower electrode layer 400 is illustrated as a flat board in FIG. 1, the inventive concept is not limited thereto. That is, as long as a capacitor structure in which a dielectric material is formed between two electrodes is maintained, the inventive concept may be applicable to a variety of structures.

The multilayer dielectric layer 500 as a capacitor dielectric layer may be formed on the lower electrode layer 400. Details of the multilayer dielectric layer 500 will be described later, and the multilayer dielectric layer 500 may be formed of a multilayer crystalline metal silicate layer. An upper electrode layer 600 may be formed on the multilayer dielectric layer 500. The upper electrode layer 600 may include a doped polysilicon, a metal (aluminum (Al), W, Cu, Ti, iridium (Ir), ruthenium (Ru), platinum (Pt), or the like), a metal silicide, or a metal nitride and/or a conductive metal oxide ($RuO_2$, $IrO_2$, $SrRuO_3$, or the like), or may be formed of a conductor that is a combination of the foregoing.

Figure 2:
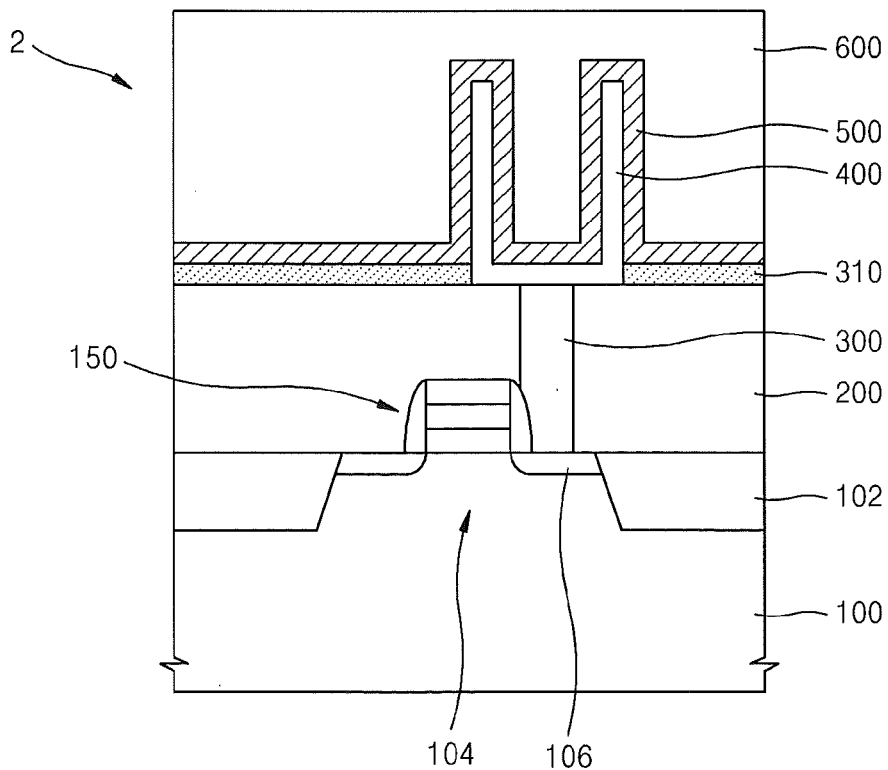
FIG. 2 is a cross-sectional view of a semiconductor device including a multilayer dielectric layer according to some embodiments.

FIG. 2 is a cross-sectional view of a semiconductor device 2 including a multilayer dielectric layer, according to further embodiments of the inventive concept.

Referring to FIG. 2, the lower electrode layer 400 may have a cylindrical shape. In order to form the lower electrode layer 400 having a cylindrical shape, a mold layer (not shown) may be formed on the interlayer insulating layer 200, in which the contact plug 300 is formed. Next, an opening (not shown) through which the contact plug 300 is exposed may be formed in the mold layer and then a lower electrode material layer (not shown) may be formed on the mold layer so as to cover an entire surface of the opening instead of completely filling the opening. Then, the lower electrode material layer formed on a surface of the mold layer other than the surface of the opening may be removed to leave only the lower electrode material layer formed on the surface of the opening to form the lower electrode layer 400 having the cylindrical shape. The mold layer may then be removed.

In order to prevent the interlayer insulating layer 200 from being removed while removing the mold layer, an etch stopping layer 310 through which the contact plug 300 is exposed may be formed on the interlayer insulating layer 200.

The multilayer dielectric layer 500 and the upper electrode layer 600 may be sequentially formed on the lower electrode layer 400 having the cylindrical shape so that the semiconductor device 2 including a capacitor may be formed.

Figure 3:
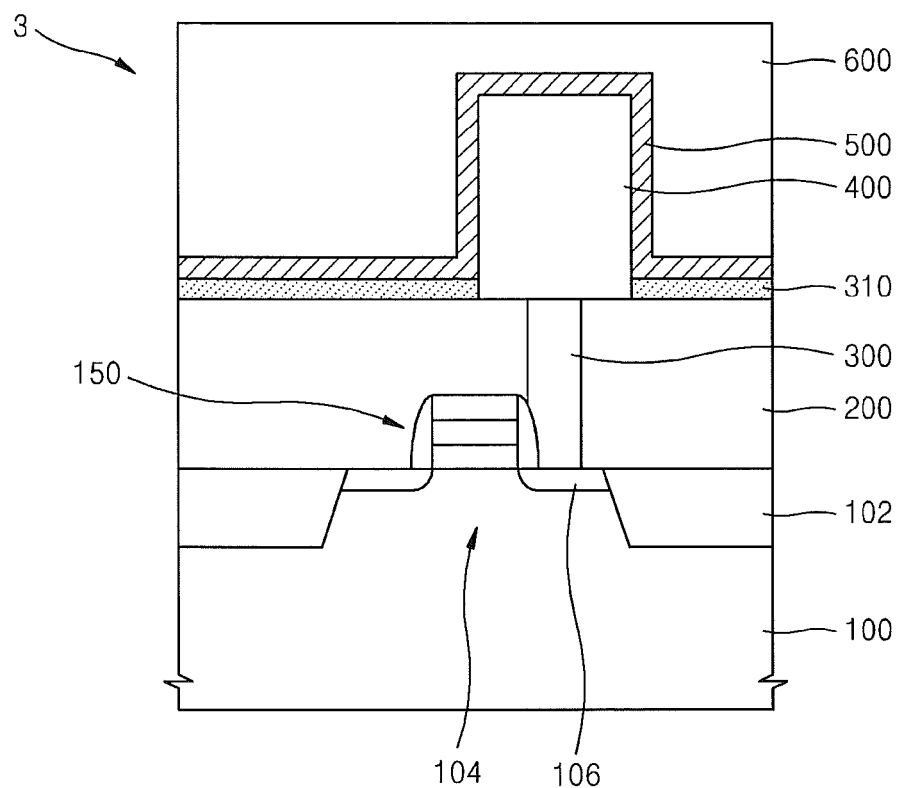
FIG. 3 is a cross-sectional view of a semiconductor device including a multilayer dielectric layer according to some embodiments.

FIG. 3 is a cross-sectional view of a semiconductor device 3 including a multilayer dielectric layer according to further embodiments of the inventive concept.

Referring to FIG. 3, the lower electrode layer 400 may have a pillar shape. In order to form the lower electrode layer 400 having the pillar shape, a mold layer (not shown) may be formed on the interlayer insulating layer 200, in which the contact plug 300 is formed. An opening (not shown) through which the contact plug 300 is exposed may be formed in the mold layer and then a lower electrode material layer (not shown) may be formed on the mold layer so as to completely fill the opening. Then, the lower electrode material layer formed on the mold layer and not in the opening may be removed to leave only the lower electrode material layer that is formed in the opening to form the lower electrode layer 400 having the pillar shape. The mold layer is then removed.

In order to prevent the interlayer insulating layer 200 from being removed while removing the mold layer, the etch stopping layer 310 through which the contact plug 300 is exposed may be formed on the interlayer insulating layer 200.

The multilayer dielectric layer 500 and the upper electrode layer 600 may be sequentially formed on the lower electrode layer 400 having the pillar shape so that a semiconductor device 3 including a capacitor may be formed.

Figure 4:
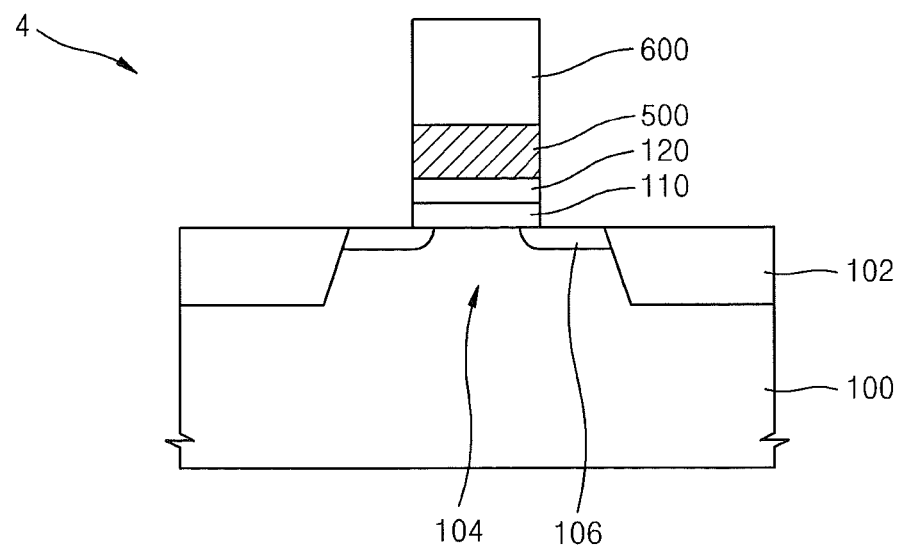
FIG. 4 is a cross-sectional view of a semiconductor device including a multilayer dielectric layer according to some embodiments.

FIG. 4 is a cross-sectional view of a semiconductor device 4 including a multilayer dielectric layer, according to further embodiments of the inventive concept.

Referring to FIG. 4, the semiconductor device 4 includes the multilayer dielectric layer 500, which may be used as a blocking insulating layer. A tunneling insulating layer 110 may be formed on the semiconductor substrate 100. The semiconductor substrate 100 may be formed of, for example, a general semiconductor such as a silicon substrate. An impurities injection region (not shown), such as a well for forming a semiconductor device (e.g., a transistor), may be formed in the semiconductor substrate 100. The device separation layer 102 for separating semiconductor devices and the source and drain regions 106 may further be formed in the semiconductor substrate 100.

The tunneling insulating layer 110 may be formed so as to allow tunneling to occur and to have a thickness in the range of 30 angstroms to 800 angstroms. The tunneling insulating layer 110 may be a silicon oxide ($SiO_2$) layer or may include an insulating layer having a high dielectric constant, for example, a hafnium or zirconium oxide layer, but the inventive concept is not limited thereto.

A charge storing layer 120 may be formed on the tunneling insulating layer 110. The charge storing layer 120 may be formed so as to have a thickness in the range of 20 angstroms to 200 angstroms, and may be formed according to various embodiments. When the charge storing layer 120 is formed of a conductor, the charge storing layer 120 may function as a floating gate. In this case, the charge storing layer 120 may be formed of, for example, a conductor including a polysilicon that is not doped, a polysilicon doped with an n-type or p-type impurity, and/or a metal.

When the charge storing layer 120 is formed of an insulator, the charge storing layer 120 may function as a trap layer. The charge storing layer 120 functioning as the trap layer may be formed of a material having a dielectric constant greater than that of a silicon oxide and lower than that of a blocking insulating layer that will be described later. For example, when the dielectric constant of the silicon oxide is 3.9, the charge storing layer 120 may be formed of a silicon nitride layer having a dielectric constant of about 6. In this manner, the blocking insulating layer may be formed so as to have a dielectric constant greater than 6. In this case, the charge storing layer 120 may be formed of a nitride layer such as a silicon nitride layer, an aluminum nitride layer, and/or a silicon oxynitride layer.

The multilayer dielectric layer 500 may be formed on the charge storing layer 120 so as to function as the blocking insulating layer. The electrode layer 600 may be formed on the multilayer dielectric layer 500. Details of the multilayer dielectric layer 500 will be described later, and the multilayer dielectric layer 500 may be formed of a multilayer crystalline metal silicate layer. The electrode layer 600 may be formed of a doped polysilicon, a metal (Al, W, Cu, Ti, Ir, Ru, Pt, or the like), a metal silicide, and a metal nitride and/or a conductive metal oxide ($RuO_2$, $IrO_2$, $SrRuO_2$, or the like), or may be formed of a conductor that is a combination of the foregoing.

As described above, when the charge storing layer 120 is formed of a conductor, a flash memory as a floating gate type nonvolatile memory device may be formed. On the other hand, when the charge storing layer 120 is formed of an insulator, a charge trap type flash memory as a floating trap type nonvolatile memory device may be formed.

FIGS. 5 through 10 are cross-sectional views of multilayer dielectric layers according to some embodiments. The multilayer dielectric layers of FIGS. 5 through 10 may be selectively applied to manufacturing of semiconductor devices including the multilayer dielectric layer 500 of FIGS. 1 through 4.

Figure 5:
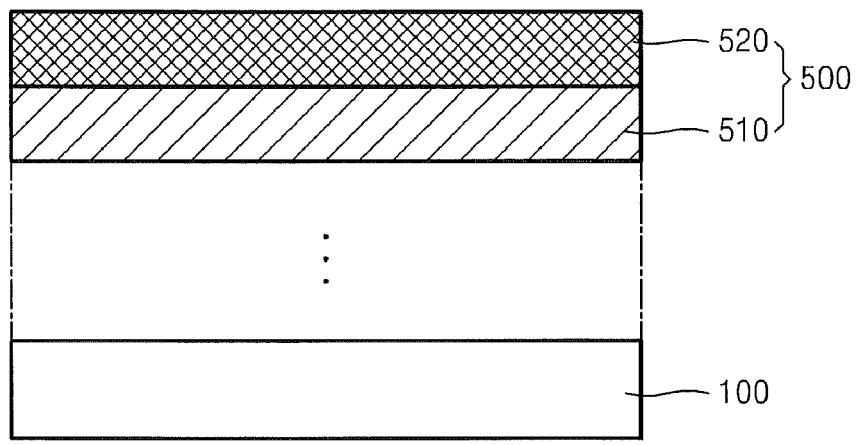
FIG. 5 is a cross-sectional view of a multilayer dielectric layer according to some embodiments.

FIG. 5 is a cross-sectional view of the multilayer dielectric layer 500, according to some embodiments of the inventive concept.

Referring to FIG. 5, the multilayer dielectric layer 500 is formed on the semiconductor substrate 100. The multilayer dielectric layer 500 includes a first crystalline metal silicate layer 510 and a second crystalline metal silicate layer 520. The first crystalline metal silicate layer 510 and/or the second crystalline metal silicate layer 520 may be formed by atomic layer deposition (ALD).

The first crystalline metal silicate layer 510 and/or the second crystalline metal silicate layer 520 may include a hafnium silicate, a zirconium silicate, and/or a hafnium-zirconium silicate. In some embodiments, the first crystalline metal silicate layer 510 and the second crystalline metal silicate layer 520 may be formed of the same kind of metal silicate, although in other embodiments the first crystalline metal silicate layer 510 and the second crystalline metal silicate layer 520 may be formed of different metal silicates. In some embodiments, the first crystalline metal silicate layer 510 and the second crystalline metal silicate layer 520 may each be formed of a hafnium-zirconium silicate.

The multilayer dielectric layer 500 including the first crystalline metal silicate layer 510 and the second crystalline metal silicate layer 520 may have a crystalline structure of a cubic system, a tetragonal system, or an orthorhombic system.

In cubic system, tetragonal system, and orthorhombic system, there are three crystal axes perpendicular one another ($\theta_1=\theta_2=\theta_3=90°$). All of three lattice constants are identical ($a_1=a_2=a_3$) in the cubic system. The cubic system may also be referred to as an isometric system. Two of three lattice constants are identical each other and the one of the lattice constants is different from the two ($a_4=a_5 \neq a_6$) in the tetragonal system. All of lattice constants are different one another ($a_7 \neq a_8$, $a_8 \neq a_9$, $a_7 \neq a_9$) in orthorhombic system.

When the first crystalline metal silicate layer 510 or the second crystalline metal silicate layer 520 is formed to have a relatively small thickness in order to apply to a highly-integrated semiconductor device, it may be difficult to distinguish the values of lattice constants. Accordingly, in this case, the values of lattice constants are not particularly distinguished, and "the cubic system, the tetragonal system, or the orthorhombic system" is thus used herein.

A ratio of silicon atoms included in the first crystalline metal silicate layer 510 or the second crystalline metal silicate layer 520 with respect to a sum of metal atoms and silicon atoms that are included therein is referred to herein as a silicon (Si) concentration. The silicon concentrations of the first crystalline metal silicate layer 510 and the second crystalline metal silicate layer 520 may be different from each other, and may be referred to herein as first and second silicon concentrations, respectively.

For example, the second silicon concentration may be greater than the first silicon concentration in some embodiments. In this case, a ratio of silicon atoms with respect to a sum of metal atoms and silicon atoms that are included in the multilayer dielectric layer 500, that is, an average silicon concentration, may have a value corresponding to a value between the first silicon concentration and the second silicon concentration.

As the silicon concentration of one of the crystalline metal silicate layers is increased, densification of a thin film may further be increased by compressive stress caused by silicon atoms, thereby increasing the reliability of the multilayer dielectric layer 500. However, as the silicon concentration of one of the crystalline metal silicate layers is increased, the dielectric constant thereof may be decreased. Accordingly, the overall average silicon concentration of the multilayer dielectric layer 500 including the first crystalline metal silicate layer 510 and the second crystalline metal silicate layer 520 may be in the range of about 3% to about 8% in order to achieve reliability and a high dielectric constant.

In some embodiments, the second silicon concentration of the second crystalline metal silicate layer 520 may be in the range of about 10% to about 20%. The overall silicon concentration of the multilayer dielectric layer 500 may then be determined by the first silicon concentration of the first crystalline metal silicate layer 510 and the relative thicknesses of the first and second crystalline metal silicate layer 510 and 520. For example, the first silicon concentration and the second silicon concentration may be respectively about 4% and about 10%, and a ratio of thicknesses between the first crystalline metal silicate layer 510 and the second crystalline metal silicate layer 520 may be about 1:2, so that the average silicon concentration of the multilayer dielectric layer 500 may be about 8%.

As such, the thicknesses and silicon concentrations, that is, the first and second concentrations, of the first crystalline metal silicate layer 510 and the second crystalline metal silicate layer 520 may be selected in consideration of the desired thickness and average silicon concentration of the multilayer dielectric layer 500.

The first crystalline metal silicate layer 510 and the second crystalline metal silicate layer 520 may be formed into an in-situ crystallized state. Alternatively, one of the metal silicate layer may have a relatively high silicon concentration and may be crystallized at a higher deposition temperature. In this case, the other metal silicate layer having a relatively low silicon concentration may be formed into an in-situ crystallized state and then the crystalline metal silicate layer having a relatively low silicon concentration may be used as a seed, so that the metal silicate layer having a relatively high silicon concentration is formed into an in-situ crystallized state.

For example, the first crystalline metal silicate layer 510 may be first formed into an in-situ crystallized state and then the first crystalline metal silicate layer 510 may be used as a seed, so that the second crystalline metal silicate layer 520 may be formed on the first crystalline metal silicate layer 510 into an in-situ crystallized state.

Figure 6:
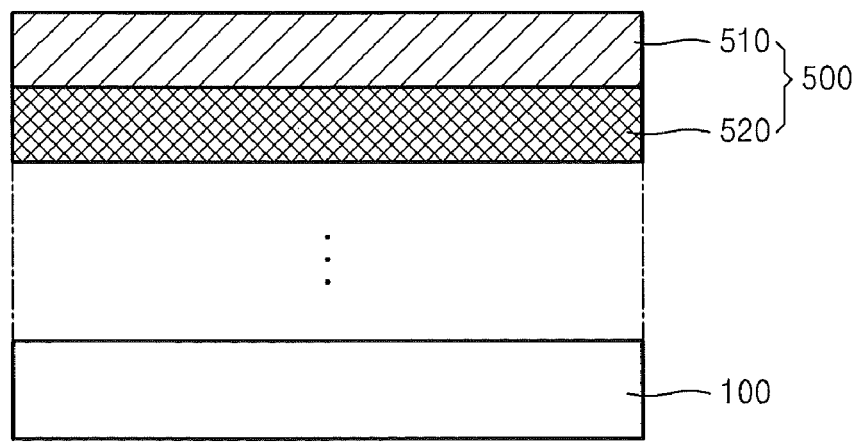
FIG. 6 is a cross-sectional view of a multilayer dielectric layer according to some embodiments.

FIG. 6 is a cross-sectional view of the multilayer dielectric layer 500, according to further embodiments of the inventive concept.

Referring to FIG. 6, the multilayer dielectric layer 500 is formed on the semiconductor substrate 100. In the embodiments illustrated in FIG. 6, the second crystalline metal silicate layer 520 may be formed on the substrate 100, and the first crystalline metal silicate layer 510 may be formed on the second crystalline metal silicate layer 520. The second crystalline metal silicate layer 520 and/or the first crystalline metal silicate layer 510 may be formed by ALD.

The multilayer dielectric layer 500 including the first crystalline metal silicate layer 510 and the second crystalline metal silicate layer 520 may have a crystalline structure of the cubic system, the tetragonal system, or the orthorhombic system.

The second silicon concentration, which is a silicon concentration of the second crystalline metal silicate layer 520, may be greater than the first silicon concentration, which is a silicon concentration of the first crystalline metal silicate layer 510. In this case, the average silicon concentration of the multilayer dielectric layer 500 may be in the range of about 3% to about 8%. The second silicon concentration of the second crystalline metal silicate layer 520 may be in the range of about 10% to about 20%.

Figure 7:
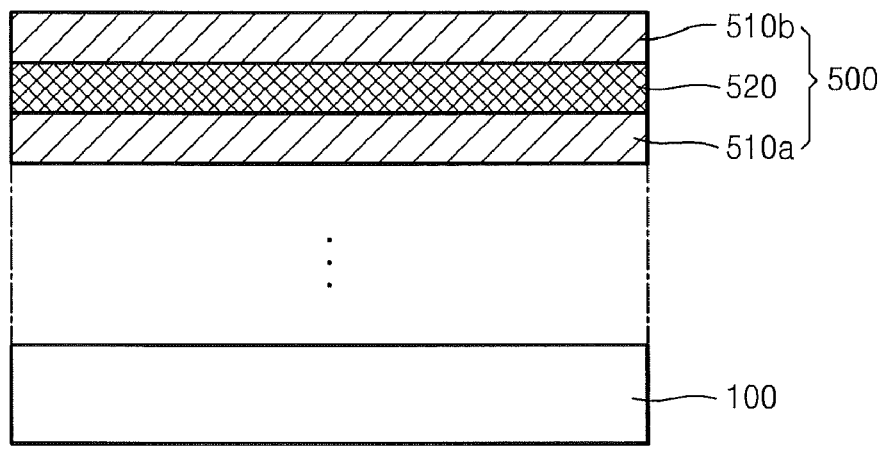
FIG. 7 is a cross-sectional view of a multilayer dielectric layer according to some embodiments.

FIG. 7 is a cross-sectional view of a multilayer dielectric layer 500, according to further embodiments of the inventive concept.

Referring to FIG. 7, the multilayer dielectric layer 500 is formed on the semiconductor substrate 100. The multilayer dielectric layer 500 may include a high silicon concentration crystalline metal silicate layer 520 that is interposed between two low silicon concentration crystalline metal silicate layers 510a, 510b. The low silicon concentration crystalline metal silicate layers 510a, 510b and/or the high silicon concentration crystalline metal silicate layer 520 may be formed by ALD.

In this manner, the multilayer dielectric layer 500 including the low crystalline metal silicate layers 510a, 510b and the high silicon concentration crystalline metal silicate layer 520 may have a crystalline structure of the cubic system, the tetragonal system, or the orthorhombic system.

The silicon concentration of the high silicon concentration crystalline metal silicate layer 520, may be greater than the silicon concentration of the low silicon concentration crystalline metal silicate layers 510a, 510b. In some embodiments, the average silicon concentration of the multilayer dielectric layer 500 may be in the range of about 3% to about 8%, and the silicon concentration of the high silicon concentration crystalline metal silicate layer 520 may be in the range of about 10% to about 20%.

The silicon concentrations of the low silicon concentration crystalline metal silicate layers 510a, 510b and the relative thicknesses of the first and second crystalline metal silicate layers 510 and 520 may be determined based on the desired average silicon concentration of the multilayer dielectric layer 500. For example, the silicon concentration of the low silicon concentration metal silicate layers 510a, 510b may be about 4%, the silicon concentration of the high silicon concentration metal silicate layer 520 may be about 10%, and the ratio of a sum of the thicknesses of the low silicon concentration metal silicate layers 510a, 510b to the thickness of the high silicon concentration crystalline metal silicate layer 520 may be about 2:1, so that the average silicon concentration of the multilayer dielectric layer 500 may be about 6%.

In some embodiments, the two low silicon concentration crystalline metal silicate layers 510a, 510b may have different silicon concentrations from each other. However, in this case, each of the silicon concentrations of the two low silicon concentration crystalline metal silicate layers 510a, 510b may be lower than the silicon concentration of the high silicon concentration crystalline metal silicate layer 520.

In some embodiments, there may be three or more low silicon concentration crystalline metal silicate layers 510a, 510b. In this case, one high silicon concentration crystalline metal silicate layer 520 may be disposed between two adjacent low silicon concentration crystalline metal silicate layers 510a, 510b, or each of two or more high silicon concentration crystalline metal silicate layers 520 may be disposed between two corresponding adjacent low silicon concentration crystalline metal silicate layers 510a, 510b, so that the multilayer dielectric layer 500 is formed. That is, the multilayer dielectric layer 500 may include m high silicon concentration crystalline metal silicate layers 520 that are disposed between m+1 low silicon concentration crystalline metal silicate layers 510a, 510b, wherein m is a positive integer greater than 2.

Figure 8:
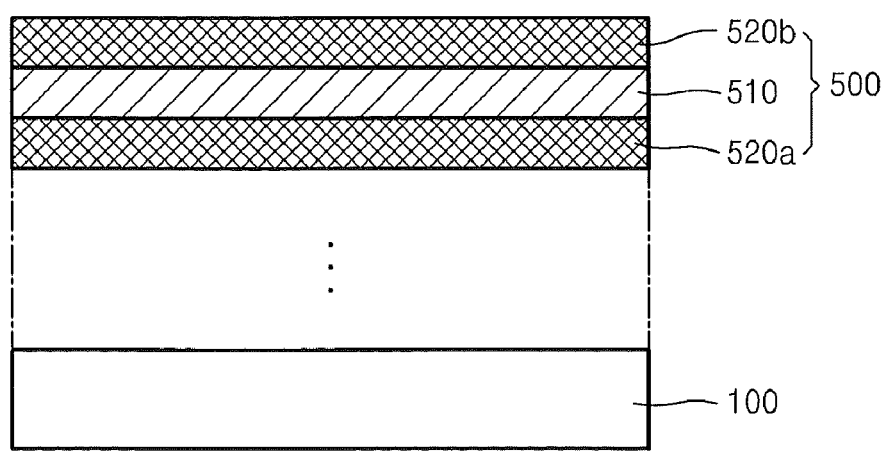
FIG. 8 is a cross-sectional view of a multilayer dielectric layer according to some embodiments.

FIG. 8 is a cross-sectional view of the multilayer dielectric layer 500, according to further embodiments of the inventive concept.

The multilayer dielectric layer 500 is formed on the semiconductor substrate 100. The multilayer dielectric layer 500 may include a low silicon concentration crystalline metal silicate layer 510 that is disposed between two high silicon concentration crystalline metal silicate layers 520a, 520b. The multilayer dielectric layer 500 including the low silicon concentration crystalline metal silicate layer 510 and the high silicon concentration crystalline metal silicate layers 520a, 520b may have a crystalline structure of the cubic system, the tetragonal system, or the orthorhombic system.

The silicon concentration of the high silicon concentration crystalline metal silicate layers 520a, 520b may be greater than the silicon concentration of the low silicon concentration crystalline metal silicate layer 510. The average silicon concentration of the multilayer dielectric layer 500 may be in the range of about 3% to about 8%. In some embodiments, the silicon concentration of the high silicon concentration crystalline metal silicate layers 520a, 520b may be in the range of about 10% to about 20%.

The silicon concentration of the low silicon concentration crystalline metal silicate layer 510 and the thicknesses of the crystalline metal silicate layers 510, 520a and 520b may be determined based on the desired average silicon concentration of the multilayer dielectric layer 500. For example, the silicon concentration of the low silicon concentration crystalline metal silicate layer 510 may be about 4%, the silicon concentration of the high silicon concentration crystalline metal silicate layers 520a, 520b may be about 10%, and the ratio of the thickness of the low silicon concentration crystalline metal silicate layer 510 to a sum of the thicknesses of the two high silicon concentration crystalline metal silicate layers 520a, 520b may be about 1:2, so that the average silicon concentration of the multilayer dielectric layer 500 may be about 8%.

In some embodiments, the two high silicon concentration crystalline metal silicate layers 520a, 520b may have different silicon concentrations from each other. In that case, each of the silicon concentrations of the two high silicon concentration crystalline metal silicate layers 520a, 520b may be greater than the silicon concentration of the low silicon concentration crystalline metal silicate layer 510.

In some embodiments, there may be three or more high silicon concentration crystalline metal silicate layers 520a, 520b. In that case, one low silicon concentration crystalline metal silicate layer 510 may be disposed between two adjacent high silicon concentration crystalline metal silicate layers 520a, 520b, or each of two or more low silicon concentration crystalline metal silicate layers 510 may be disposed between two corresponding adjacent high silicon concentration crystalline metal silicate layers 520a, 520b, so that the multilayer dielectric layer 500 is formed. That is, the multilayer dielectric layer 500 may include n low silicon concentration crystalline metal silicate layers 510 that are disposed between n+1 high silicon concentration crystalline metal silicate layers 520a, 520b, wherein n is a positive integer greater than 2.

Figure 9:
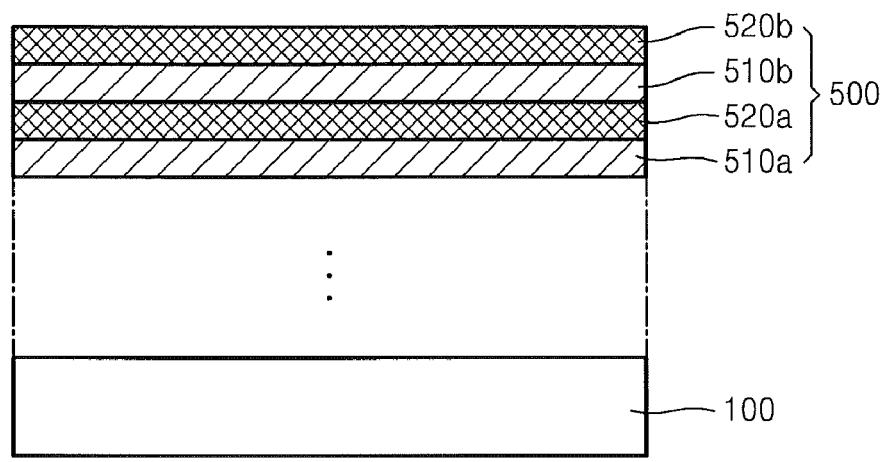
FIG. 9 is a cross-sectional view of a multilayer dielectric layer according to some embodiments.

FIG. 9 is a cross-sectional view of the multilayer dielectric layer 500, according to further embodiments of the inventive concept.

Referring to FIG. 9, the multilayer dielectric layer 500 is formed on the semiconductor substrate 100. The multilayer dielectric layer 500 may include sequentially and alternately formed low silicon concentration crystalline metal silicate layers 510a, 510b and high silicon concentration crystalline metal silicate layers 520a, 520b. In some embodiments, the multilayer dielectric layer 500 may include low crystalline metal silicate layers 510a, 510b and high silicon concentration crystalline metal silicate layers 520a, 520b each sequentially and alternately formed three or more times.

Figure 10:
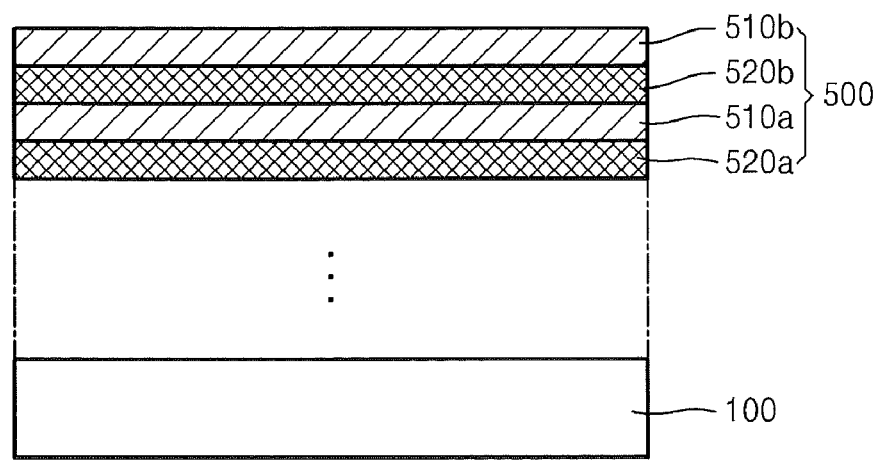
FIG. 10 is a cross-sectional view of a multilayer dielectric layer, according to another embodiment of the inventive concept.

FIG. 10 is a cross-sectional view of the multilayer dielectric layer 500, according to further embodiments of the inventive concept.

Referring to FIG. 10, the multilayer dielectric layer 500 is formed on the semiconductor substrate 100. The multilayer dielectric layer 500 may include the high crystalline metal silicate layers 520a, 520b and low crystalline metal silicate layers 510a, 510b each sequentially and alternately formed twice. In further embodiments, the multilayer dielectric layer 500 may include the high silicon concentration crystalline metal silicate layers 520a, 520b and low silicon concentration crystalline metal silicate layers 510a, 510b each sequentially and alternately formed three or more times.

Multilayer dielectric layers 500 having various aspects has been described with reference to FIGS. 5 through 10. In addition, a multilayer dielectric layer 500 according to some embodiments may include three or more crystalline metal silicate layers having various silicon concentrations, as long as the average silicon concentration of the multilayer dielectric layer 500 is in the range of about 3% to about 8%.

Figure 11:
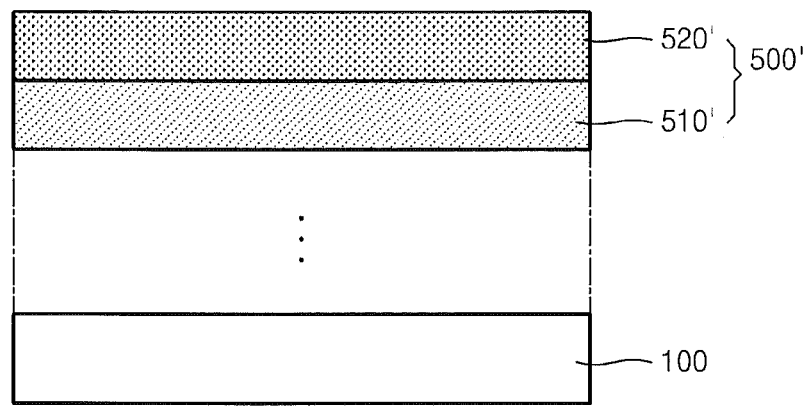
FIGS. 11 through 13 are cross-sectional views that illustrate methods of manufacturing a multilayer dielectric layer according to some embodiments.
Figure 12:
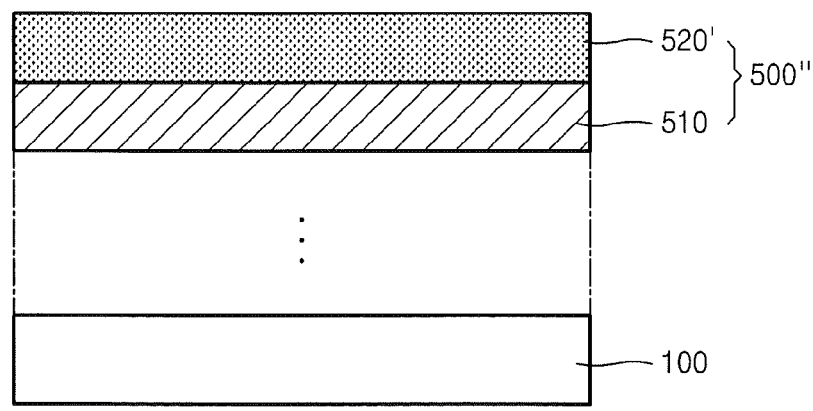
Figure 13:
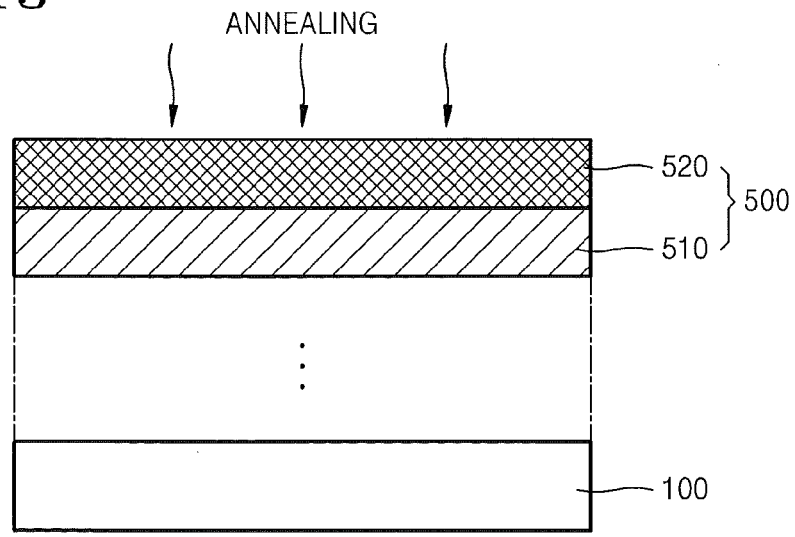

FIGS. 11 through 13 are cross-sectional views illustrating methods of manufacturing a multilayer dielectric layer, according to some embodiments.

Referring to FIG. 11, a first preliminary multilayer dielectric layer 500' including a first amorphous metal silicate layer 510' and a second amorphous metal silicate layer 520' is formed on a semiconductor substrate 100.

Alternatively, referring to FIG. 12, a second preliminary multilayer dielectric layer 500'' including a first crystalline metal silicate layer 510 and the second amorphous metal silicate layer 520a is formed on the semiconductor substrate 100.

Referring to FIGS. 11 and 13, the first amorphous metal silicate layer 510' and second amorphous metal silicate layer 520' may be crystallized into the first crystalline metal silicate layer 510 and a second crystalline metal silicate layer 520, respectively, by annealing the first preliminary multilayer dielectric layer 500', so that the multilayer dielectric layer 500 is formed.

In this case, the first amorphous metal silicate layer 510' may first be crystallized into the first crystalline metal silicate layer 510, and in this case, the second amorphous metal silicate layer 520' may be crystallized into the second crystalline metal silicate layer 520 by using the first crystalline metal silicate layer 510 as a seed. In this case, the second amorphous metal silicate layer 520' may be crystallized into the second crystalline metal silicate layer 520 at a lower annealing temperature than an annealing temperature at which only the second amorphous metal silicate layer 520' is crystallized.

Alternatively, referring to FIGS. 12 and 13, the second amorphous metal silicate layer 520' may be crystallized into the second crystalline metal silicate layer 520 by annealing the second preliminary multilayer dielectric layer 500', so that the multilayer dielectric layer 500 is formed.

In this case, the second amorphous metal silicate layer 520' may be crystallized into the second crystalline metal silicate layer 520 by using the first crystalline metal silicate layer 510 as a seed. In this case, the second amorphous metal silicate layer 520' may be crystallized into the second crystalline metal silicate layer 520 at a lower annealing temperature than an annealing temperature at which only the second amorphous metal silicate layer 520' is crystallized.

The multilayer dielectric layer 500 of FIG. 13 has the same shape as the multilayer dielectric layer 500 of FIG. 5. Accordingly, a multilayer dielectric layer may have the same shape as the multilayer dielectric layers 500 of FIGS. 6 through 10, and may also be formed by applying the method of manufacturing the multilayer dielectric layer of FIGS. 11 through 13.

Figure 14:
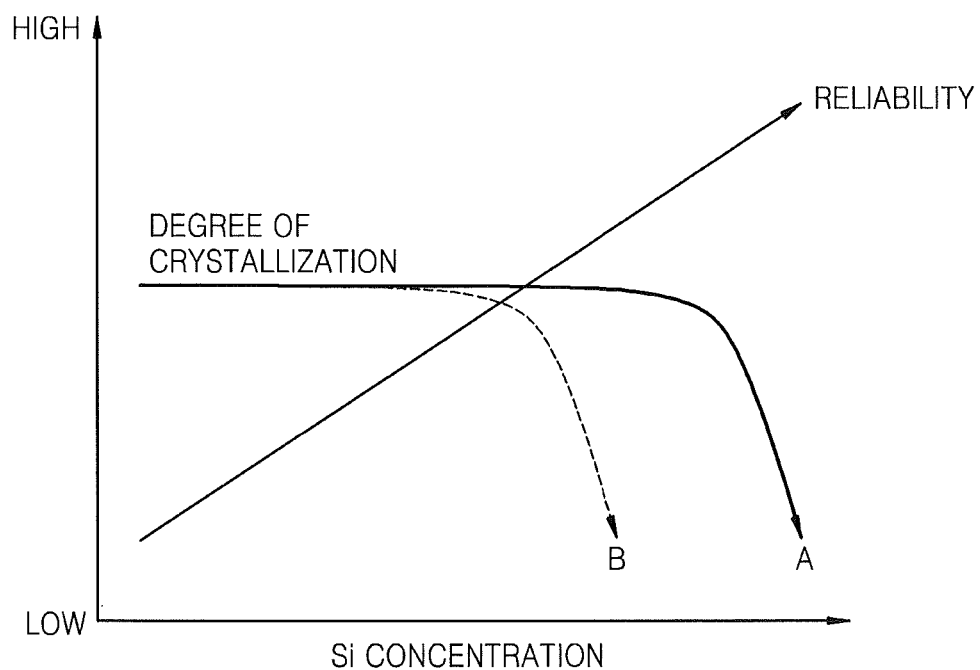
FIG. 14 is a graph showing a hypothetical comparison of characteristics between a multilayer dielectric layer and a single-layer crystalline metal silicate layer according to some embodiments.

FIG. 14 is a graph showing a hypothetical comparison of characteristics between a multilayer dielectric layer and a single-layer crystalline metal silicate layer, according to some embodiments.

Referring to FIG. 14, as a silicon concentration of the multilayer dielectric is increased, reliability of the multilayer dielectric is improved, but the degree of crystallization of the multilayer dielectric is rapidly decreased after a predetermined silicon concentration. However, the degree of crystallization of a multilayer dielectric layer A according to an embodiment of the inventive concept is maintained even at silicon concentrations where the degree of crystallization of a single-layer crystalline metal silicate layer B is not maintained.

Ratios of silicon atoms with respect to sums of metal atoms and silicon atoms that are respectively included in the multilayer dielectric layer A and the single-layer crystalline metal silicate layer B, that is, average silicon concentrations thereof, are the same, and thicknesses of the multilayer dielectric layer A and the single-layer crystalline metal silicate layer B are the same, as well. That is, as described in FIG. 5, in the multilayer dielectric layer A, the ratio of the thicknesses of the first crystalline metal silicate layer 510 having a silicon concentration of about 4% with respect to the second crystalline metal silicate layer 520 having a silicon concentration of about 10% may be about 1:2, so that when the average silicon concentration is about 8%, and thus a silicon concentration of the single-layer crystalline metal silicate layer B may also be about 8%.

Accordingly, even if the silicon concentration of the multilayer dielectric layer A according to an embodiment of the inventive concept is further increased, the degree of crystallization of the multilayer dielectric layer A is relatively higher than that of the single-layer crystalline metal silicate layer B. A dielectric layer having a relatively higher degree of crystalline may have a relatively higher dielectric constant. Accordingly, the multilayer dielectric layer A according to an embodiment of the inventive concept may be formed to have a dielectric constant greater than that of the single-layer crystalline metal silicate layer B, and thus may have an improved reliability.

Figure 15:
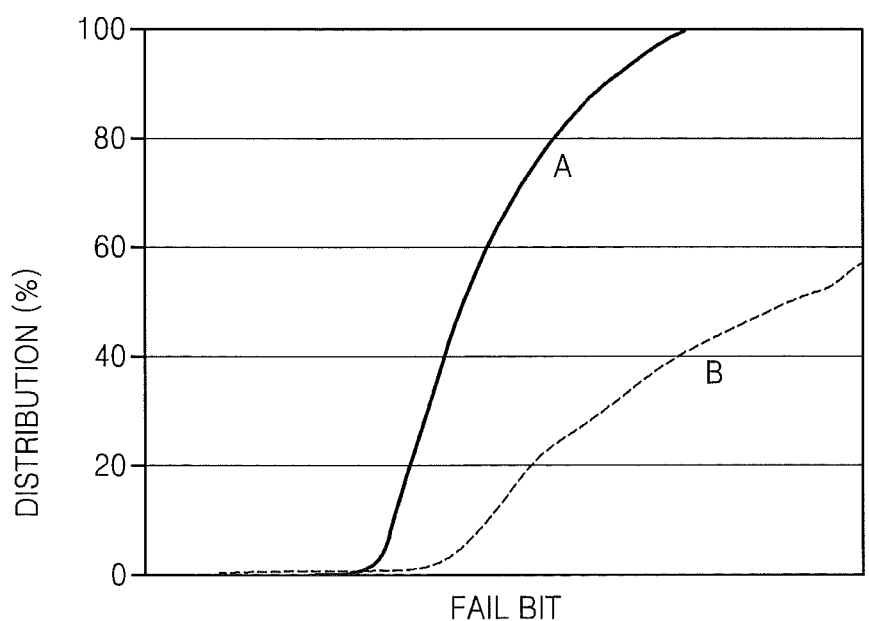
FIG. 15 is a graph showing a comparison of characteristics between a semiconductor device including a multilayer dielectric layer and a semiconductor device including a single-layer crystalline metal silicate layer according to some embodiments.

FIG. 15 is a graph of a cumulative distribution function showing a comparison of characteristics between a semiconductor device including a multilayer dielectric layer A and a semiconductor device including a single-layer crystalline metal silicate layer B, according to an embodiment of the inventive concept.

Referring to FIG. 15, a number of fail bits of a semiconductor device including the multilayer dielectric layer A is greatly lower than that of a semiconductor device including the single-layer crystalline metal silicate layer B for a given distribution. Therefore, the fail bit characteristic of the semiconductor device using the multilayer dielectric layer A may be superior to that of the semiconductor device using the single-layer crystalline metal silicate layer B.

Figure 16:
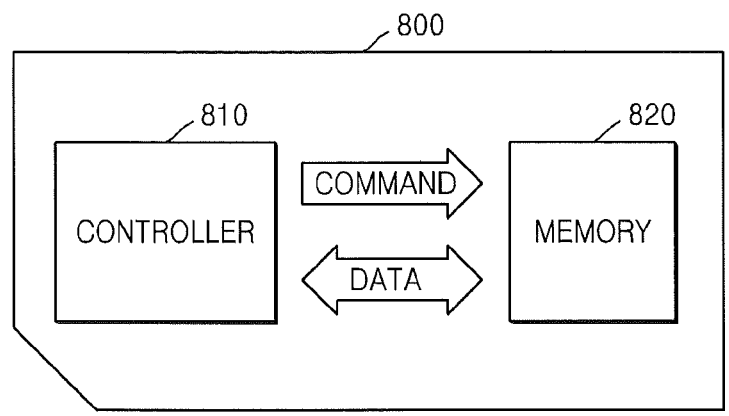
FIG. 16 is a schematic view illustrating a card according to some embodiments.

FIG. 16 is a schematic view illustrating a card 800, according to an embodiment of the inventive concept.

Referring to FIG. 16, a controller 810 and a memory 820 may be disposed to exchange electrical signals with each other. For example, according to a command of the controller 810, the memory 820 and the controller 810 may exchange electrical data with each other. Thus, the card 800 may store data in the memory 820 and/or may output data from the memory 820 to the outside.

The memory 820 may include a memory device such as the semiconductor device of FIGS. 1 through 4. The memory device may include any of various memory devices, for example, a dynamic random access memory (DRAM), a static random access memory (SRAM), a flash memory, a phase change RAM (PRAM), etc.

The card 800 may be used in various portable electronic apparatuses, for example, a multi media card (MMC) or a secure digital card (SD).

Figure 17:
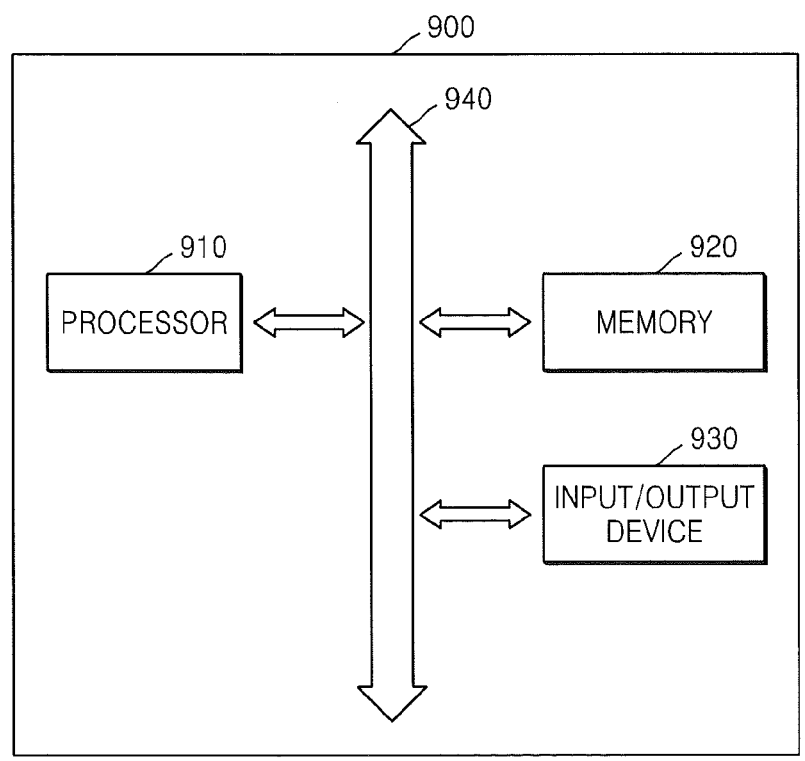
FIG. 17 is a block diagram illustrating a system according to some embodiments.

FIG. 17 is a block diagram illustrating a system 900, according to an embodiment of the inventive concept.

Referring to FIG. 17, a processor 910, an input/output device 930 and a memory 920 may perform data communication with one another via a bus 940. The processor 910 executes a program and controls the system 900. The input/output device 930 may be used to input or output data of the system 900. The system 900 is connected to an external apparatus, e.g., a personal computer (PC) or a network, via the input/output device 930, so as to exchange data therebetween.

The memory 920 may store a code and data for an operation of the processor 910. The memory 920 may include a memory device such as the semiconductor device of FIGS. 1 through 4. The memory device may include any memory device, for example, a DRAM, an SRAM, a flash memory device, a PRAM, etc.

For example, the system 900 may be used in various portable electronic apparatuses such as a mobile phone, an MP3 player, a navigator, a solid state disk (SSD) or household appliances.

While the inventive concept has been particularly shown and described with reference to exemplary embodiments thereof, it will be understood that various changes in form and details may be made therein without departing from the spirit and scope of the following claims.

What is claimed is:

1. A method of forming a semiconductor device, the method comprising:
    forming a multilayer dielectric layer comprising metal atoms and silicon atoms on a semiconductor substrate;
    wherein the multilayer dielectric layer comprises at least two crystalline metal silicate layers having different silicon concentrations, which are ratios of silicon atoms with respect to sums of metal atoms and silicon atoms;
    wherein forming the multilayer dielectric layer comprises:
        forming a first crystalline metal silicate layer having a first silicon concentration in an in-situ crystallized state;
        forming a second metal silicate layer having a second silicon concentration that is greater than the first silicon concentration on the first crystalline metal silicate layer; and
        forming a second crystalline metal silicate layer by crystallizing the second metal silicate layer using the first crystalline metal silicate as a seed layer.

2. The method of claim 1, wherein the multilayer dielectric layer has a crystalline structure of a cubic system or an orthorhombic system.

3. The method of claim 1, wherein the first crystalline metal silicate layer and the second crystalline metal silicate layer comprise zirconium containing silicate.

4. The method of claim 1, wherein forming the multilayer dielectric layer comprises forming at least two first crystalline metal silicate layers, and forming the second crystalline metal silicate layer between the at least two first crystalline metal silicate layers.

5. The method of claim 1, wherein a ratio of silicon atoms with respect to a sum of metal atoms and silicon atoms that are included in the multilayer dielectric layer is in the range of about 3% to about 8%.

6. The method of claim 5, wherein the second silicon concentration is in the range of about 10% to about 20%.

7. A method of forming a semiconductor device, the method comprising:
    forming a multilayer dielectric layer comprising metal atoms and silicon atoms on a semiconductor substrate;
    wherein the multilayer dielectric layer comprises at least two crystalline metal silicate layers having different silicon concentrations, which are ratios of silicon atoms with respect to sums of metal atoms and silicon atoms;
    wherein forming the multilayer dielectric layer comprises:
    forming a first crystalline metal silicate layer having a first silicon concentration in an in-situ crystallized state; and
    forming a second crystalline metal silicate layer comprises forming the second crystalline metal silicate layer having a second silicon concentration that is greater than the first silicon concentration on the first crystalline metal silicate layer in an in-situ crystallized state using the first crystalline metal silicate layer as a seed.

8. The method of claim 1, wherein the second metal silicate layer is crystallized at a temperature lower than a temperature that would otherwise be required to crystallize the second metal silicate layer in the absence of the seed layer.

9. The method of claim 1, wherein the first crystalline metal silicate layer and the second crystalline metal silicate layer comprise hafnium-zirconium silicate.

10. The method of claim 7, wherein the first crystalline metal silicate layer and the second crystalline metal silicate layer comprise hafnium-zirconium silicate.

11. The method of claim 7, wherein the multilayer dielectric layer comprises forming at least two first crystalline metal silicate layers, and forming the second crystalline metal silicate layer between the at least two first crystalline metal silicate layers.

* * * * *